(12) United States Patent
Matsui et al.

(10) Patent No.: US 6,975,164 B1
(45) Date of Patent: Dec. 13, 2005

(54) METHOD AND DEVICE FOR GENERATING CONSTANT VOLTAGE

(75) Inventors: Katsuaki Matsui, Tokyo (JP); Yoshimasa Sekino, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/014,401

(22) Filed: Jan. 27, 1998

(30) Foreign Application Priority Data

Mar. 17, 1997 (JP) ................................. H9-063031

(51) Int. Cl.[7] .............................................. G05F 1/10
(52) U.S. Cl. .................................... 327/541; 323/316
(58) Field of Search ............................ 327/538, 540, 327/541, 543; 323/315, 316

(56) References Cited

U.S. PATENT DOCUMENTS

| | | | |
|---|---|---|---|
| 4,634,894 A | | 1/1987 | Shu et al. |
| 5,063,304 A | * | 11/1991 | Iyengar ...................... 327/543 |
| 5,194,762 A | * | 3/1993 | Hara et al. .................. 327/537 |
| 5,335,203 A | * | 8/1994 | Ishii et al. ................... 327/543 |
| 5,467,052 A | * | 11/1995 | Tsukada ...................... 327/543 |
| 5,856,756 A | * | 1/1999 | Sasahara et al. ............. 327/540 |
| 5,936,455 A | * | 8/1999 | Kobayashi et al. .......... 327/437 |
| 6,222,357 B1 | * | 4/2001 | Sakuragi ..................... 323/316 |
| 6,650,175 B2 | * | 11/2003 | Messager ..................... 327/541 |

FOREIGN PATENT DOCUMENTS

| | | |
|---|---|---|
| JP | 52-18151 | 2/1977 |
| JP | 61-217815 | 9/1986 |
| JP | 2-18115 | 2/1990 |
| JP | 4-328613 | 11/1992 |
| JP | 5-63151 | 3/1993 |
| JP | 5-102395 | 4/1993 |
| JP | 7-286924 | 10/1995 |
| JP | 8-44449 | 2/1996 |
| JP | 8-69332 | 3/1996 |
| JP | 8-272461 | 10/1996 |

* cited by examiner

*Primary Examiner*—Terry D. Cunningham
(74) *Attorney, Agent, or Firm*—Wenderoth, Lind & Ponack, L.L.P.

(57) ABSTRACT

In order to generate a constant voltage, a reference voltage is generated. Short wave noises are cut off from the reference voltage. A control signal is generated based on the reference voltage and an output voltage. The output voltage is controlled in response to the control signal to provide a constant output voltage.

8 Claims, 16 Drawing Sheets

METHOD AND DEVICE FOR GENERATING CONSTANT VOLTAGE

CROSS REFERENCE TO RELATED APPLICATION

This application claims the priority of Application No. H09-063031, filed Mar. 17, 1997 in Japan, the subject matter of which is incorporated herein by reference.

TECHNICAL FIELD OF THE INVENTION

The present invention relates to a method and a device for generating a constant voltage, and more particularly to a method and a device for generating a constant voltage that is useful to a DRAM (Dynamic Random Access Memory).

BACKGROUND OF THE INVENTION

In general, a constant voltage generation device is designed to includes a reference voltage generator, a differential amplifier and an output circuit. The reference voltage generator generates a reference voltage of a predetermined level. The output circuit generates an output voltage, which is controlled to be constant. The differential amplifier is supplied with the reference voltage and the output voltage to provide the difference between them. In response to the output signal of the differential amplifier, the output circuit is controlled to output a constant output voltage.

In such a constant voltage generation device, some noises may enter into the reference voltage and cause problems. Especially if short wave noises are successively entered into the reference voltage, the output voltage is oscillated.

OBJECTS OF THE INVENTION

Accordingly, an object of the invention is to provide a method for generating a constant voltage that reduces an effect of short wave noises.

Another object of the invention is to provide a constant voltage generation device that reduces an effect of short wave noises.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the invention, a method for generating a constant voltage includes the steps of generating a reference voltage; removing short wave noises from the reference voltage; generating an output voltage; generating a control signal based on the reference voltage and the output voltage; and controlling the output voltage in response to the control signal to provide a constant output voltage.

According to a second aspect of the invention, a method for generating a constant voltage includes the steps of generating a reference voltage; generating an output voltage; generating a control signal based on the reference voltage and the output voltage; and removing short wave noises from the control signal to provide a second control signal; controlling the output voltage in response to the second control signal to provide a constant output voltage.

According to a third aspect of the invention, a method for generating a constant voltage includes the steps of generating a reference voltage; generating an output voltage; extracting short wave noises from the reference voltage; supplying the extracted noises into the output voltage; generating a control signal based on the reference voltage and the output voltage; and controlling the output voltage in response to the control signal to provide a constant output voltage.

According to a fourth aspect of the invention, a constant voltage generation device includes a reference voltage generation circuit which generates a reference voltage; an output circuit which generates an output voltage; a differential amplifier which generates a control signal based on the reference voltage and the output voltage; and a noise control circuit which cuts off short wave noises from the reference voltage, to be supplied to the differential amplifier. The output voltage is controlled in response to the control signal to provide a constant output voltage.

According to a fifth aspect of the invention, a constant voltage generation device includes a reference voltage generation circuit which generates a reference voltage; an output circuit which generates an output voltage; a differential amplifier which generates a control signal based on the reference voltage and the output voltage; and a noise control circuit which cuts off short wave noises from the control signal to provide a second control signal. The output voltage is controlled in response to the second control signal to provide a constant output voltage.

According to a sixth aspect of the invention, a constant voltage generation device includes a reference voltage generation circuit which generates a reference voltage; an output circuit which generates an output voltage; a differential amplifier which generates a control signal based on the reference voltage and the output voltage; and a noise control circuit. The noise control circuit extracts short wave noises from the reference voltage, to be supplied to a first input terminal of the differential amplifier, and supplies the extracted noises into the output voltage, to be supplied to a second input terminal of the differential amplifier. The output voltage is controlled in level in response to the control signal to provide a constant output voltage.

DETAILED DISCLOSURE OF THE INVENTION

Figure 1:
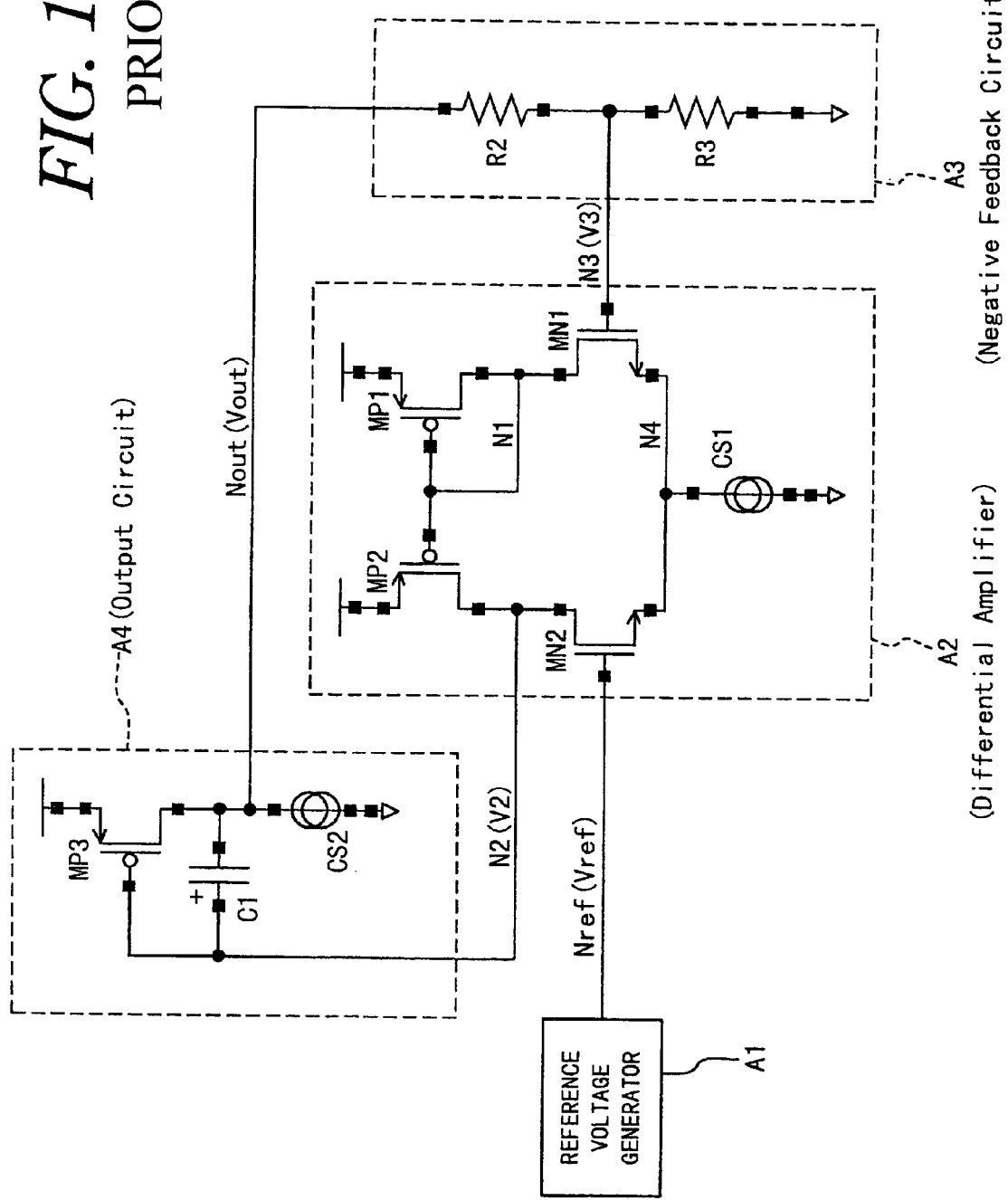
FIG. 1 is a circuit diagram illustrating a constant voltage generation device according to a conventional technology.

For better understanding of the invention, background technology is first described. FIG. 1 shows a conventional device for generating a constant voltage, which includes a reference voltage generator A1, a differential amplifier A2, a negative feedback circuit A3 and an output circuit A4. The reference voltage generator A1 generates a predetermined reference voltage $V_{ref}$ and supplies it to a sixth node $N_{ref}$. The differential amplifier A2 detects the difference between the reference voltage $V_{ref}$ and a feedback voltage V3 from the negative feedback circuit A3, and amplifies the difference to generate an output signal (control signal) V2. The negative feedback circuit A3 divides an output voltage $V_{out}$ of the output circuit A4 and supplies the divided voltage to an input terminal of the differential amplifier A2. The output circuit A4 generates the output voltage $V_{out}$ in response to the control signal V2 at a node N2, supplied from the differential amplifier A2. The output voltage $V_{out}$ is supplied to an output node $N_{out}$.

In the device, if the feedback voltage (divided voltage) V3 is lower than the reference voltage $V_{ref}$, the output voltage $V_{out}$ is controlled to go up. On the other hand, if the feedback voltage (divided voltage) V3 is higher than the reference voltage $V_{ref}$, the output voltage $V_{out}$ is controlled to go down. Thus, the output voltage $V_{out}$ is controlled to meet the following equation:

$$V_{out}=V_{ref}*(R2+R3)/R3$$

The differential amplifier A2 includes PMOS transistors MP1 and MP2, forming a current mirror circuit, NMOS transistors MN1 and MN2 and a constant current source CS1. The PMOS transistor MP1 is connected at gate and drain to a first node N1, and at a source to a power supply ($V_{cc}$). The PMOS transistor MP2 is connected at a gate to the first node N1, at a drain to a second node N2 and at a source to the power supply ($V_{cc}$).

The NMOS transistor MN1 is connected at a gate to a third node, at a drain to the first node N1 and at a source to a fourth node N4. NMOS transistor MN2 is connected at a gate to the sixth node $N_{ref}$, at a drain to the second node and at a source to the fourth node N4. The constant current source CS1 is connected between the fourth node N4 and the ground ($V_{ss}$).

The negative feedback circuit A3 includes resistors R2 and R3 serially connected between the output node $N_{out}$ and the ground $V_{ss}$. The voltage V3 is generated at the third node N3, located between the resistors R2 and R3. In other words, the negative feedback circuit A3 generate the voltage V3 in accordance with the following equation:

$$V3=V_{out}*R3/(R2+R3)$$

The output circuit A4 includes a PMOS transistor MP3, a constant current source CS2 and a capacitor C1. The PMOS transistor MP3 is connected at a gate to the second node N2, at a drain to the output node $N_{out}$ and at a source to the power supply $V_{cc}$. The constant current source CS2 is connected between the output node $N_{out}$ and the ground $V_{ss}$. The capacitor C1 is connected between the second node N2 and the output node $N_{out}$.

According to the above mentioned conventional device, if noises having a wavelength shorter than the operation frequency of the reference voltage generator A1 are added to the reference voltage $V_{ref}$, the output voltage $V_{out}$ may be oscillated.

Figure 2:
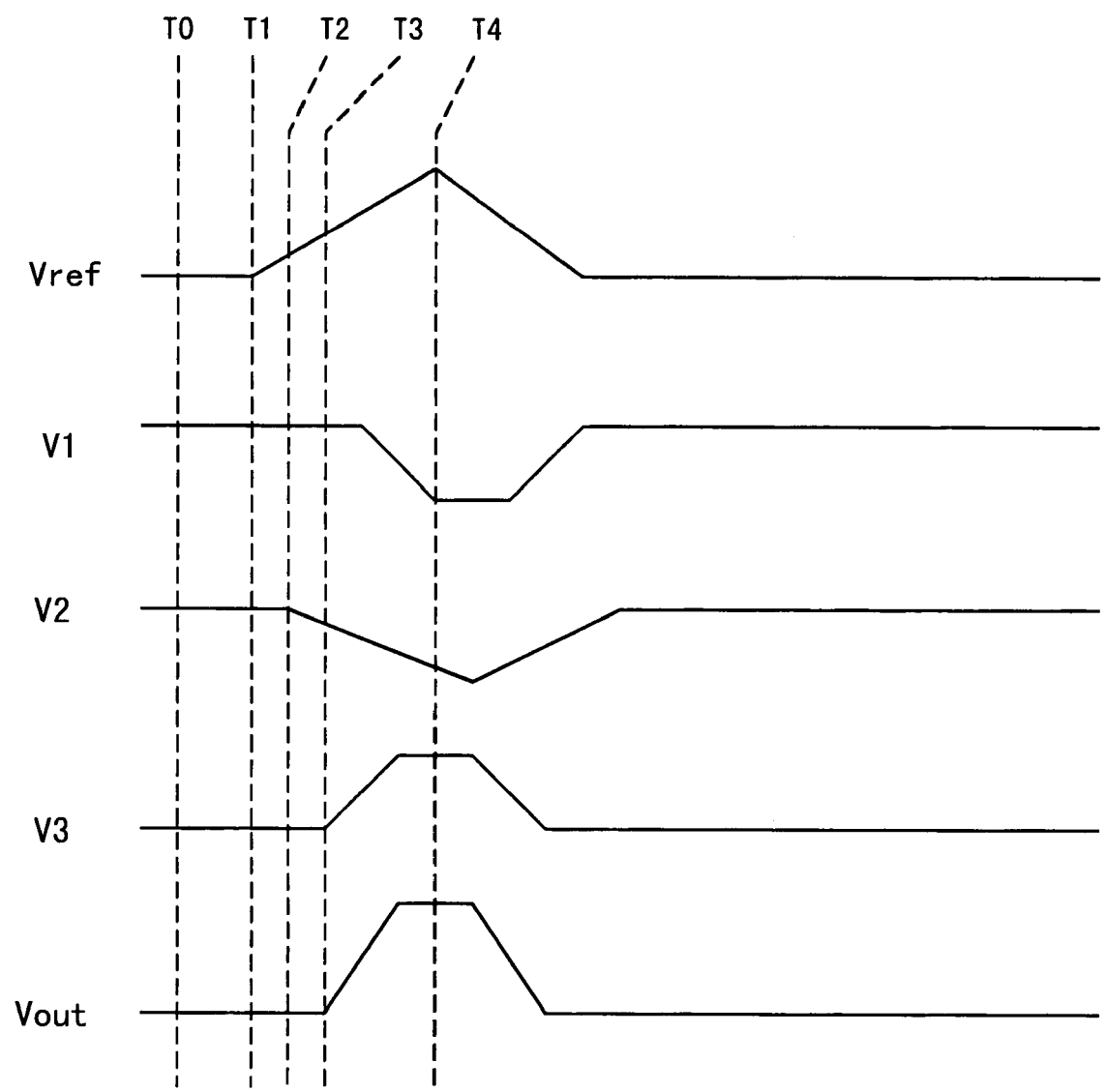
FIGS. 2 to 4 are timing charts showing the operation of the constant voltage generation device, shown in FIG. 1.

FIG. 2 shows the variations of the voltages of $V_{ref}$, V1, V2, V3 and $V_{out}$, in the case where intermittent long wave noises are added to the reference voltage $V_{ref}$. At a time T0, the voltage V1 at the first node N1 is "$V_{cc}-V_{tp}-\alpha$," where $V_{tp}$ is the threshold voltage of each PMOS transistor. The voltage V2 at the second node N2 is also "$V_{cc}-V_{tp}-\alpha$." The voltage V3 at the third node N3 is $V_{ref}$ and the output voltage $V_{out}$ at the output node $N_{out}$ is "$V_{ref}*(R2+R3)/R3$."

At a time T1, the reference voltage $V_{ref}$ start rising in response to a noise, so that the following phenomenon occurs: Current flowing through the NMOS transistor MN2 and the second node N2 to the ground $V_{ss}$ is increased.

At a time T2, the current, flowing from the second node to the ground, is further increased, so that the voltage V2 at the second node N2 is lowered. As a result, current flowing from the power supply $V_{cc}$ through the PMOS transistor MP3 to the output node $N_{out}$ is increased. In this case, the voltage V2 at the second node N2 goes down at a speed depending on the capacity of the first capacitor C1. Namely, when the capacity of the first capacitor C1 is large, the voltage V2 goes down. On the other hand, when the capacity of the first capacitor C1 is small the voltage V2 goes down quickly.

At a time T3, current flowing from the power supply $V_{cc}$ to the output node $N_{out}$ is increased, so that the output voltage $V_{out}$ at the output node $N_{out}$ goes up. The output voltage $V_{out}$ goes up until the voltage V3 at the third node N3(=$V_{out}*R3/(R2+R3)$) becomes equal to the reference voltage $V_{ref}$.

At a time T4, when the reference voltage $V_{ref}$ begins going down, the differential amplifier A2 and the negative feedback circuit A3 operate in the opposite manner as at the time T1, so that the output voltage $V_{out}$ and the voltage V3 begin going down. Those voltages are eventually stable. As mentioned above, when the voltage changes due to noises in a relatively long period, the output voltage $V_{out}$ follows the variations of the reference voltage $V_{ref}$. As a result, the output voltage $V_{out}$ changes in level in synchronization with the variations of noises.

Figure 3:
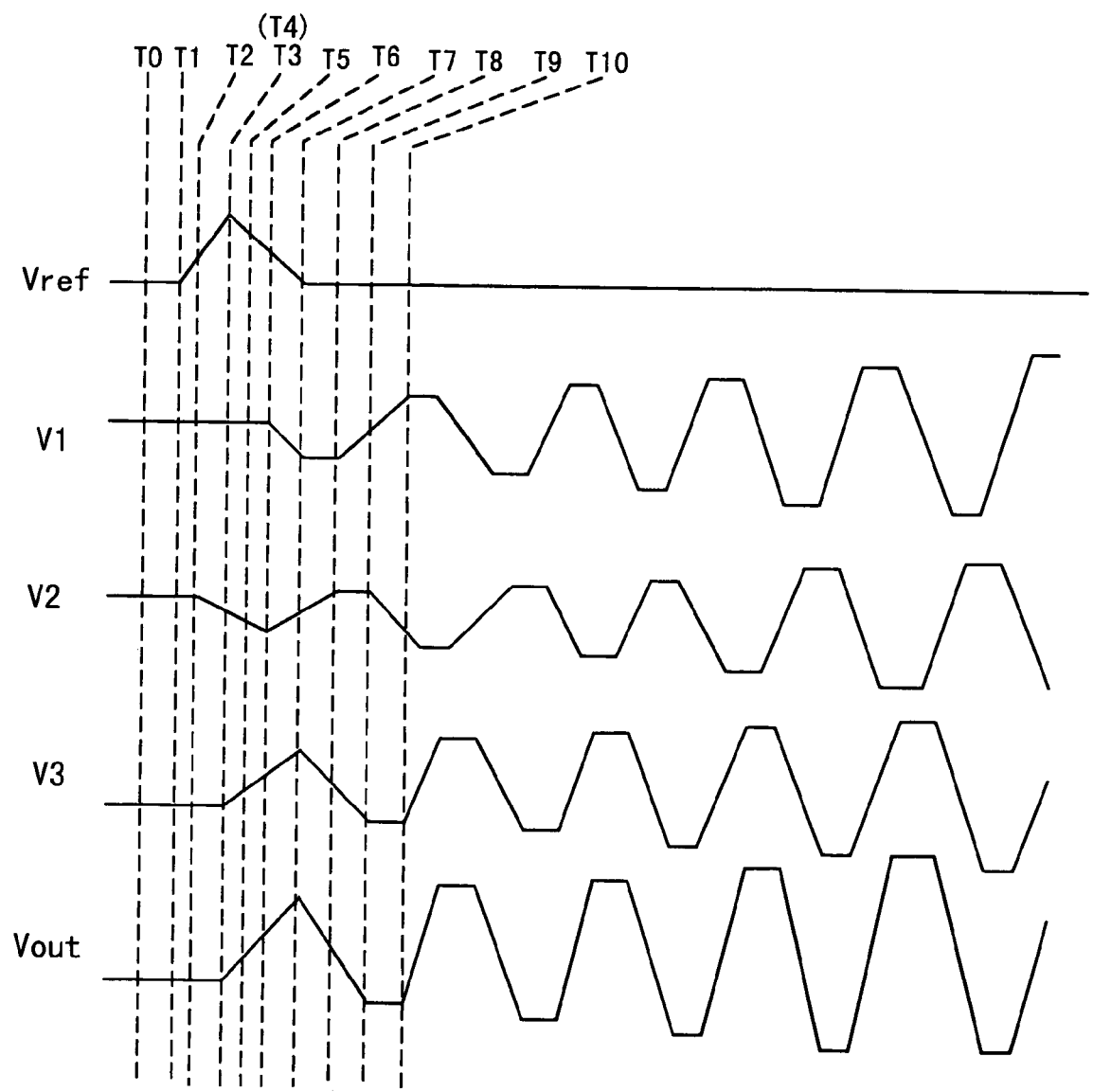

FIG. 3 shows the variations of the voltages $V_{ref}$ V1, V2, V3 and $V_{out}$ in the case where intermittent short wave noises are added to the reference voltage $V_{ref}$. It is assumed that the reference voltage $V_{ref}$ begins going down at a time T4, which is the same time or earlier than a time T3, at which the voltage V3 at the third node N3 begins rising. The time T3 may shift depending on the falling speed of the voltage V2 at the node N2, that is, depending on the capacity of the first capacitor C1. The wavelength of a noise added to the reference voltage $V_{ref}$ can be shortened independently from the capacity of the first capacitor C1, so that the time T4 can be happened at the same time or earlier than the time T3.

The short wave noises mean, in this description, that noises makes the situation in which the time T4 happens at the same time or earlier than the time T3. In FIG. 3, the time T4 happens at the same time as the time T3. In the chart shown in FIG. 3, the operation of the device until the time T3 is the same as that in FIG. 2, and therefore, the same description is not repeated in here.

At a time T5, when the voltage V3 at the third node N3 goes up, current flowing from the first node N1 through the NMOS transistor MN1, whose gate is connected to the third node N3, to the ground $V_{ss}$ is decreased.

In response to the decrease of current flowing from the first node N1 to the ground, the voltage V1 at the node N1 goes down at a time T6. Therefore, current flowing from the power supply $V_{cc}$ through the PMOS transistor MP1 to the first node N1 is increased, and current flowing from the power supply $V_{cc}$ through the PMOS transistor MP2 to the second node N2 is also increased. On the other hand, when the current flowing from the second node N2 to the ground $V_{ss}$ is decreased, the voltage V2 at the second node N2 goes up, and current flowing from the power supply $V_{cc}$ through the PMOS transistor MP3 to the output node $N_{out}$ is decreased.

When the current flowing from the power supply $V_{cc}$ to the first node N1 is increased, the voltage V1 at the first node N1 stops going down at a time T7. In response to the increase of the current flowing from the power supply $V_{cc}$ to the second node N2, the voltage V2 at the second node N2 goes more up. In response to the rise of the voltage V2 at the second node N2, the current flowing from the power supply $V_{cc}$ through the PMOS transistor MP3 to the output node $N_{out}$ is further decreased. In response to the decrease of the current flowing from the power supply $V_{cc}$ to the output node $N_{out}$, the voltages $V_{out}$ and V3 at the output node $N_{out}$ and the third node N3 go down. In response to the fall of the voltage V3 at the third node, current flowing from the first node N1 through the NMOS transistor MN1 to the ground is decreased.

In response to the decrease of current flowing from the power supply $V_{cc}$ to the output node $N_{out}$ at the time T7, the voltages $V_{out}$ and V3 at the output node $N_{out}$ and the third node N3 further go down at a time T8. In response to the fall of the voltage V3 at the third node N3, the current flowing from the first node N1 through the NMOS transistor MN1 to the ground $V_{ss}$ is further decreased. In response to the decrease of current flowing from the first node to the ground $V_{ss}$, the voltage V1 at the first node N1 goes up. When the voltage V1 at the first node N1 goes up, current flowing from the power supply $V_{cc}$ through the PMOS transistor MP1 to the first node N1 is decreased, and also current flowing from the power supply $V_{cc}$ through the PMOS transistor MP2 to the second node N2 is decreased as well.

In response to the decrease of current flowing from the power supply $V_{cc}$ to the second node N2, the voltage V2 at the second node N2 goes down, at a time T9. The fall of the voltage V2 causes that current flowing from the power supply $V_{cc}$ through the PMOS transistor MP3 to the output node $N_{out}$ to be increased. In response to the decrease of current flowing from the power supply $V_{cc}$ to the first node N1, at the time T8, the voltage V1 at the first node N1 stops going up once, and then goes up again in response to the decrease of current flowing from the first node N1 to the ground $V_{ss}$. In response to the rise of the voltage V1 at the first node N1, current flowing through from the power supply $V_{cc}$ through the PMOS transistor MP1 to the first node N1 is further decreased, and current flowing from the power supply $V_{cc}$ through the PMOS transistor MP2 to the second node N2 is further decreased as well.

At a time T10, voltages $V_{out}$ and V3 at the output node $N_{out}$ and the third node N3 go up in response to the increase of current flowing from the power supply $V_{cc}$ to the output node $N_{out}$. When the voltage V3 at the third node N3 goes up, current flowing from the first node N1 through the NMOS transistor MN1 to the ground $V_{ss}$ is increased. When current flowing from the power supply $V_{ss}$ to the first node N1 is decreased, the voltage V1 at the first node N1 stops going up. In response to the decrease of current flowing from the power supply $V_{cc}$ to the second node N2, the voltage V2 at the second node N2 further goes down. If the voltage drop at the second node N2 at the time T10 becomes larger than that at the time T2, the potential (voltage) amplitude is enlarged gradually after the time T2. As a result, the output voltage $V_{out}$ at the output node $N_{out}$ is oscillated, as shown in FIG. 3.

For avoiding the above described oscillation of the output voltage $V_{out}$, the capacity of the first capacitor C1 can be increased to increase discharge current (charge current) of the first capacitor C1, which occurs at the output node $N_{out}$ in response to the rise (fall) of the voltage V2 at the second node N2.

In this case, if short wave noises are involved in the reference voltage $V_{ref}$, the discharge current (charge current) of the first capacitor C1 is getting larger. Accordingly, when such short wave noises are added to the reference voltage $V_{ref}$, the increase (decrease) of the current flowing from the power supply $V_{cc}$ to the power potential is compensated by the discharge current (charge current) of the first capacitor C1. As a result, rise (fall) of the voltage V2 at the second node N2, which happens in response to the rise (fall) of the output voltage $V_{out}$ at the output node $N_{out}$, is prevented. And therefore, the oscillation at the output node $N_{out}$ can be prevented.

Even if the capacity of the first capacitor C1 is increased, the following problems arise if short wave noises are added to the reference voltage $V_{ref}$.

Figure 4:
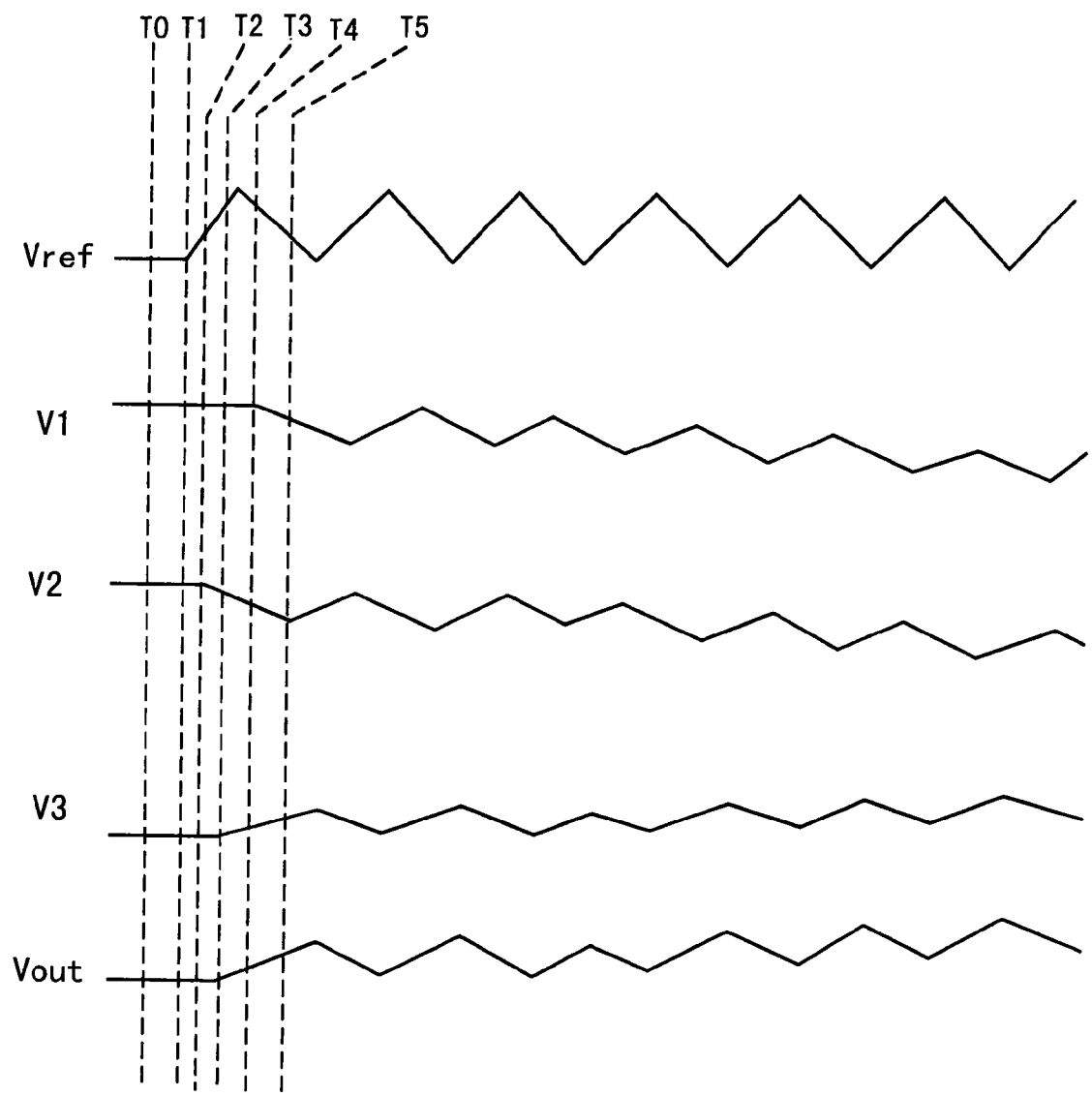

FIG. 4 shows the voltages $V_{ref}$, V1, V2, V3 and $V_{out}$ which change in level when short wave noises are successively added to the reference voltage $V_{ref}$.

At a time T1, when the reference voltage $V_{ref}$ goes up, current flowing from the second node N2 through the NMOS transistor MN2 to the ground $V_{ss}$ is increased.

In response to the increase of the current, flowing from the second node N2 to the ground $V_{ss}$, the voltage V2 at the second node N2 goes down, and current flowing from the power supply $V_{cc}$, through PMOS transistor MP3 to the output node $N_{out}$ is increased, at a time T2. In response to the fall of the voltage V2 at the second node N2, charge current flowing from the output node $N_{out}$ to the first capacitor C1 is generated.

At a time T3, the output voltage $V_{out}$ at the output node $N_{out}$ and the voltage V3 at the third node N3 go up, in response to the increase of current flowing from the power supply $V_{cc}$ through the PMOS transistor MP3 to the output node $N_{out}$. At this time, the voltages go up just a little at the output node $N_{out}$ and at the third node N3 in the case where the capacity of the first capacitor C1 is large. The voltage rise is very small relative to that in the case where the capacity of the first capacitor C1 is small because the charge current flows from the output node $N_{out}$ to the first capacitor C1. Therefore, the increase of current flowing from the first node N1 through the NMOS transistor MN1 to the ground $V_{ss}$ becomes very small. In addition, increase and decrease of current flowing at the following time T4 and T5 are also very small.

At the time T4, the voltage V1 at the first node N1 goes down in response to the increase of current flowing from the first node N1 to the ground $V_{ss}$, and therefore, current flowing from the power supply $V_{cc}$ through the PMOS transistor MP2 to the second node N2 is increased.

At the time T5, the voltage V2 at the second node N2 goes up in response to the increase of current flowing from the power supply $V_{cc}$ to the second node N2. The voltage V2 at the second node N2 goes up slowly, because the increase of the current flowing from the power supply $V_{cc}$ to the second node N2 is very small. For that reason, if the short wave noises are added successively to the reference voltage $V_{ref}$, the reference voltage $V_{ref}$ may start going up again before the voltage at the second node N2 returns to the level at the time T1. If the above described operation is repeated, the voltage V2 at the second node N2 goes down to a level lower than that at the time T0, and the output voltage $V_{out}$ at the output node $N_{out}$ goes up. Consequently, the output voltage $V_{out}$ is oscillated.

Figure 5:
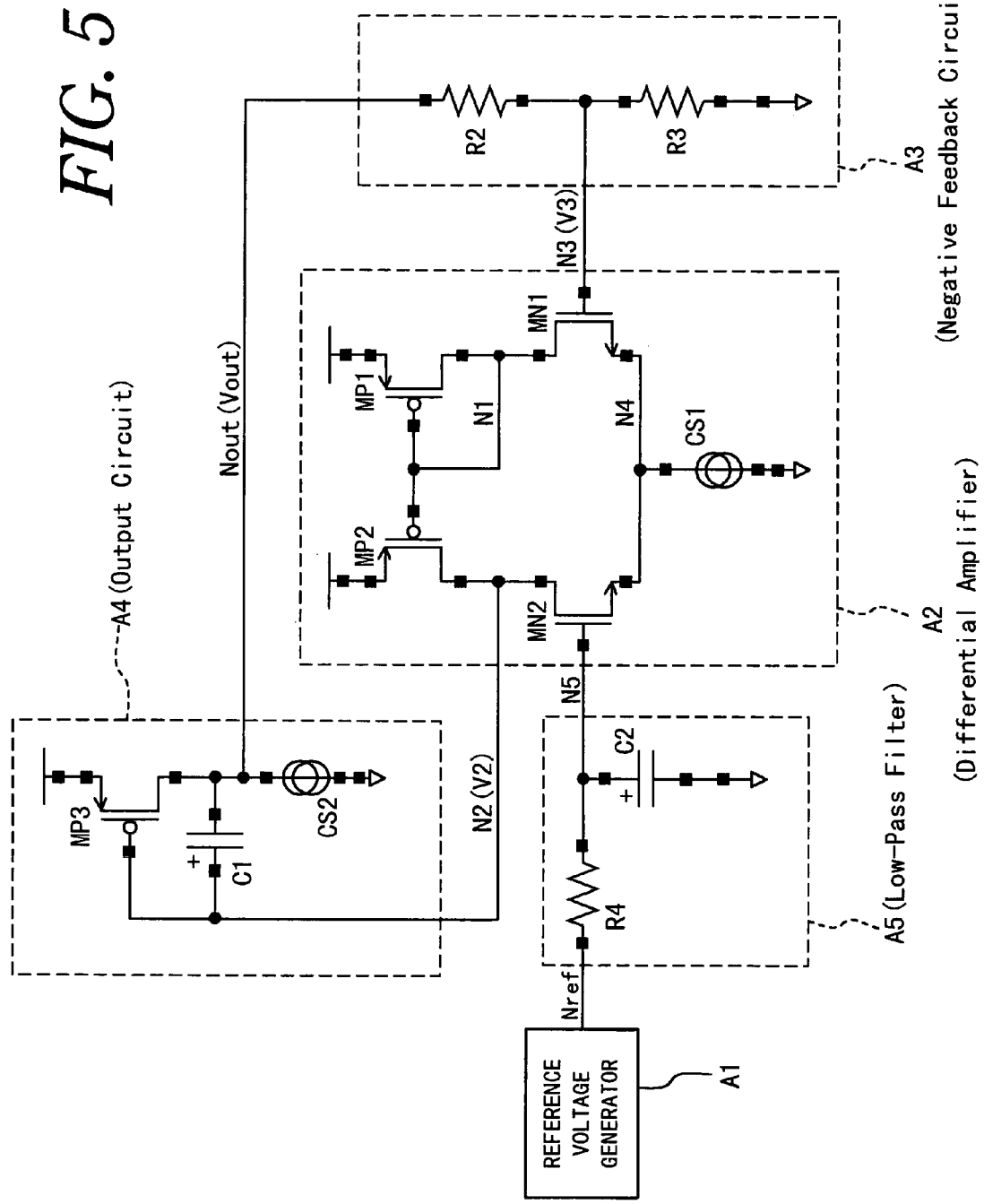
FIG. 5 is a circuit diagram illustrating a constant voltage generation device according to a first preferred embodiment of the invention.

FIG. 5 shows a constant voltage generation device according to a first preferred embodiment of the invention. In this embodiment, the same or corresponding components to those in the device shown in FIG. 1 are represented by the same symbols. In addition, detailed descriptions of the same components are not repeated here in the first preferred embodiment to avoid redundant description. The constant voltage generation device of the first preferred embodiment includes a reference voltage generator A1, a differential amplifier A2, a negative feedback circuit A3, an output circuit A4 and a low-pass filter A5.

The reference voltage generator A1 generates a predetermined reference voltage $V_{ref}$ and supplies it to a sixth node $N_{ref}$. The differential amplifier A2 detects the difference between the reference voltage $V_{ref}$ and a feedback voltage V3 from the negative feedback circuit A3, and amplifies the difference to generate an output signal (control signal) V2. The negative feedback circuit A3 divides an output voltage $V_{out}$ of the output circuit A4 and supplies the divided voltage to an input terminal of the differential amplifier A2. The output circuit A4 generates the output voltage $V_{out}$ in response to the control signal V2 at a node N2, supplied from the differential amplifier A2. The output voltage $V_{out}$ is supplied to an output node $N_{out}$.

The low-pass filter A5 includes a resistor R4, which is serially connected between the sixth node $N_{ref}$ and the fifth node N5, and a capacitor C2, which is connected to the fifth node N5 and the ground $V_{ss}$. Other types of low-pass filters are applicable to the invention.

Now, operation of the device according to the first preferred embodiment, in the case where no noise is added to the reference voltage $V_{ref}$, is first described. The differential amplifier A2 detects the voltage difference between the reference voltage $V_{ref}$, supplied from the reference voltage generator A1, and the feedback voltage V3, which is generated by resistor-dividing the output voltage $V_{out}$ at the output node $N_{out}$. When the feedback voltage V3 is lower than the reference voltage $V_{ref}$ (V3<$V_{ref}$), the gate voltage of the PMOS transistor MP3 goes down to increase the output voltage $V_{out}$. On the other hand, when the feedback voltage V3 is higher than the reference voltage $V_{ref}$ (V3>$V_{ref}$), the gate voltage of the PMOS transistor MP3 goes up to decrease the output voltage $V_{out}$. As a result, the output voltage $V_{out}$ at the output node $N_{out}$ is controlled to be a constant value of "$V_{ref}$*(R2+R3)/R3.

Figure 6:
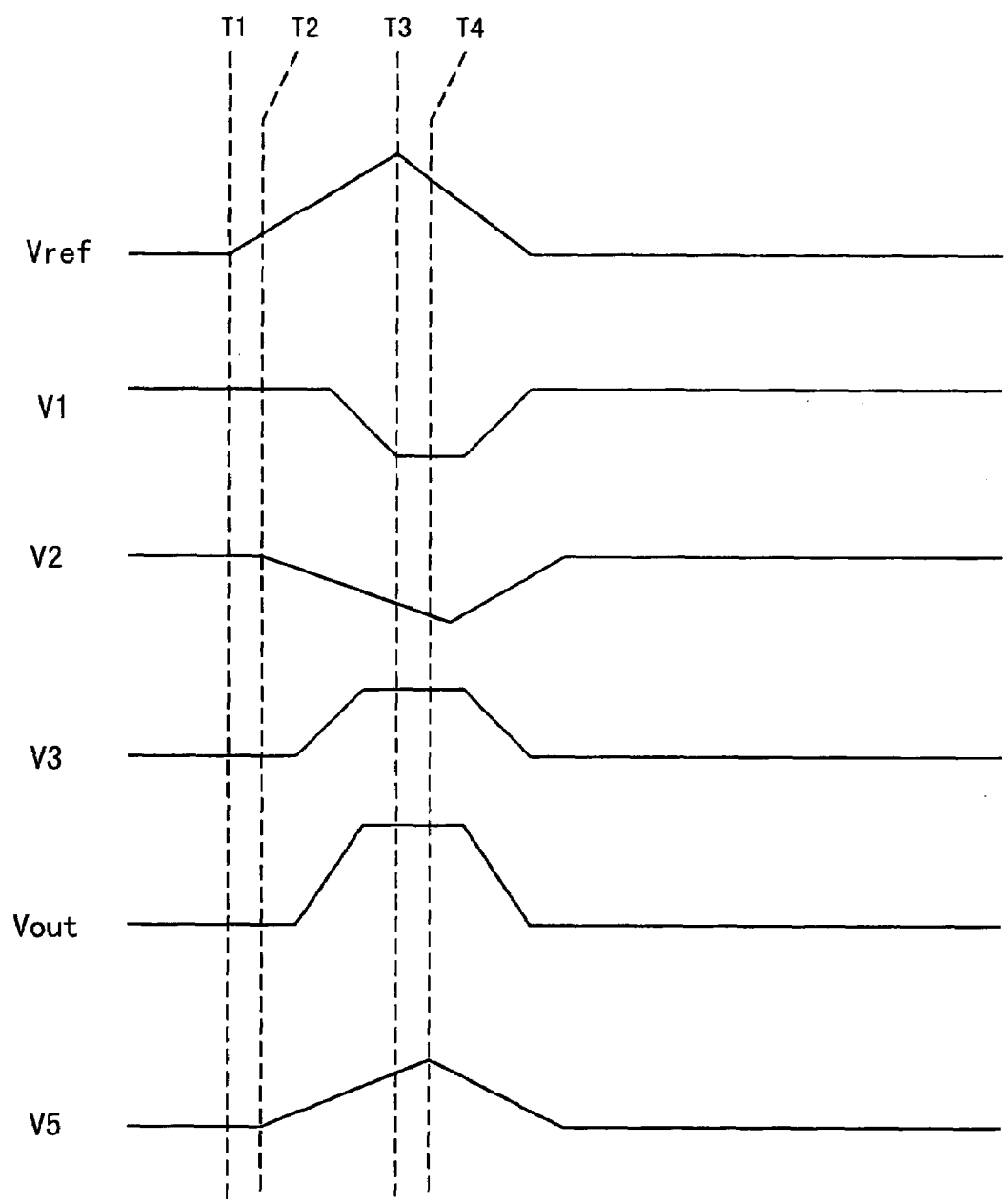
FIGS. 6 and 7 are timing charts showing the operation of the constant voltage generation device, shown in FIG. 5.

Next, operation of the device according to the first preferred embodiment, in the case where long wave noises are intermittently added to the reference voltage $V_{ref}$, is described in conjunction with FIG. 6. At a time T1, when the reference voltage $V_{ref}$ starts going up gradually in response to the noises, current is generated based on the voltage difference between the reference voltage $V_{ref}$ and a voltage at the fifth node N5. The current starts flowing from the resistor R4 to the fifth node N5. The current is used for charging the second capacitor C2, because of the long wavelength.

At a time T2, in response to the charge of the second capacitor C2, the voltage V5 at the fifth node N5 starts going up. The rising speed of the voltage V5 depends on a time constant τ that is defined by the resistance of the resistor R4 and the capacity of the second capacitor C2.

When the voltage V5 at the fifth node N5 starts going up, the voltage difference is made between the voltage V3 at the third node N3 and the voltage V5 at the fifth node N5. In proportion to the voltage difference, current flowing from the second node N2 through the NMOS transistor MN2 to the ground $V_{ss}$ is increased. As a result, the voltage V2 at the second node N2 goes down, and current flowing from the power supply $V_{cc}$ through the PMOS transistor MP3, whose gate is connected to the second node N2, to the output node $N_{out}$ is increased. The voltage V2 at the second node N2 goes down at a speed depending on the capacity of the first capacitor C1. That is, the speed becomes slower if the capacity of the first capacitor C1 is large, while the speed becomes faster if the capacity of the first capacitor C1 is small.

When current, flowing from the power supply $V_{cc}$ to the output node $N_{out}$, is increased, the output voltage $V_{out}$ at the output node $N_{out}$ goes up. At the same time, the voltage V3(=$V_{out}$*R3/(R2+R3)), to be applied through the negative feedback circuit A3 to the third node N3, starts going up. The voltage V3 at the third node N3 goes up so as to be equal to the voltage V5 at the fifth node N5. The current flowing from the PMOS transistor MP3 to the output node $N_{out}$ is eventually saturated, so that the output voltage $V_{out}$ at the output node $N_{out}$ keeps a predetermined voltage.

At a time T3, the reference voltage $V_{ref}$ starts going down. In response to the fall of the reference voltage $V_{ref}$, the voltage V5 at the fifth node N5 becomes higher than the reference voltage $V_{ref}$, and therefore, charge current of the second capacitor C2 start flowing from the fifth node N5 to the sixth node $N_{ref}$.

At a time T4, the voltage V5 at the fifth node N5 starts going down. As mentioned above, the falling speed depends on a time constant τ that is defined by the resistance of the resistor R4 and the capacity of the second capacitor C2. When the capacity of the second capacitor C2 or the resistance of the resistor R4 is large, the speed of falling becomes slower. On the other hand, when both the capacity of the second capacitor C2 and the resistance of the resistor R4 are small the speed of falling becomes faster.

As described before, when long wave noises are added to the reference voltage $V_{ref}$ the variations of the reference voltage $V_{ref}$ are transferred through the low-pass filter A5 to the fifth node N5. As a result, the output voltage $V_{out}$ at the output node $N_{out}$ only changes slowly (gradually), and the change happens temporarily, but not successively.

Figure 7:
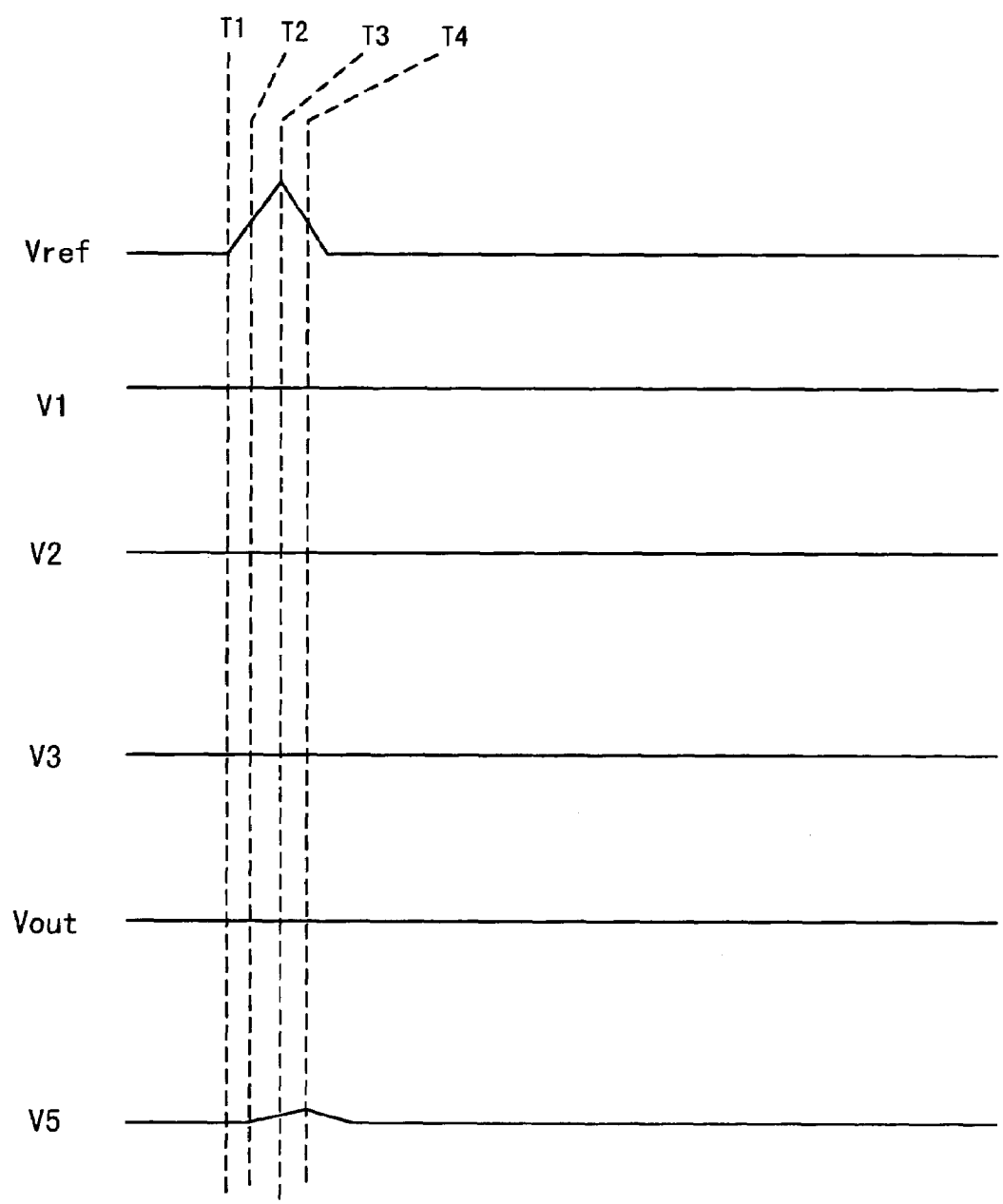

Next, operation of the device according to the first preferred embodiment, in the case where short wave noises are intermittently added to the reference voltage $V_{ref}$, is described in conjunction with FIG. 7. In this case, variations of the reference voltage $V_{ref}$ due to the short wave noises can not pass through the low-pass filter A5. In other words, even if the reference voltage $V_{ref}$ changes in level the voltage V5 at the fifth node N5 is constant.

As a result, all the voltages V1, V2, V3 and $V_{out}$ at the first, second, third and output nodes N1, N2, N3 and $N_{out}$ can be maintained to be constant. Oscillation or other problems do not occur on the output voltage $V_{out}$ at the output node $N_{out}$.

Next, operation of the device according to the first preferred embodiment, in the case where short wave noises are successively added to the reference voltage $V_{ref}$, is described. According to the before described conventional device, the problems due to successively entering short wave noises, such as oscillation, cannot be solved. In contrast, according to the first preferred embodiment, even if short wave noises are successively added to the reference voltage $V_{ref}$, the effect of the noises is shut out by the low-pass filter A5, so that the voltage V5 at the fifth node N5 can be maintained as constant.

As a result, all the voltages V1, V2, V3 and $V_{out}$ at the first, second, third and output nodes N1, N2, N3 and $N_{out}$ can be maintained to be constant. Oscillation or other problems do not occur on the output voltage $V_{out}$ at the output node $N_{out}$.

As described above, according to the first preferred embodiment, the low-pass filter A5 is provided between the reference voltage generator A1 and the differential amplifier A2, so that voltage variations due to the short wave noises are not transferred to the input terminal of the differential amplifier A2. As a result, oscillation and voltage variations of the output voltage $V_{out}$ at the output node $N_{out}$ can be effectively avoided, and therefore, the output voltage $V_{out}$ is maintained being constant.

Figure 8:
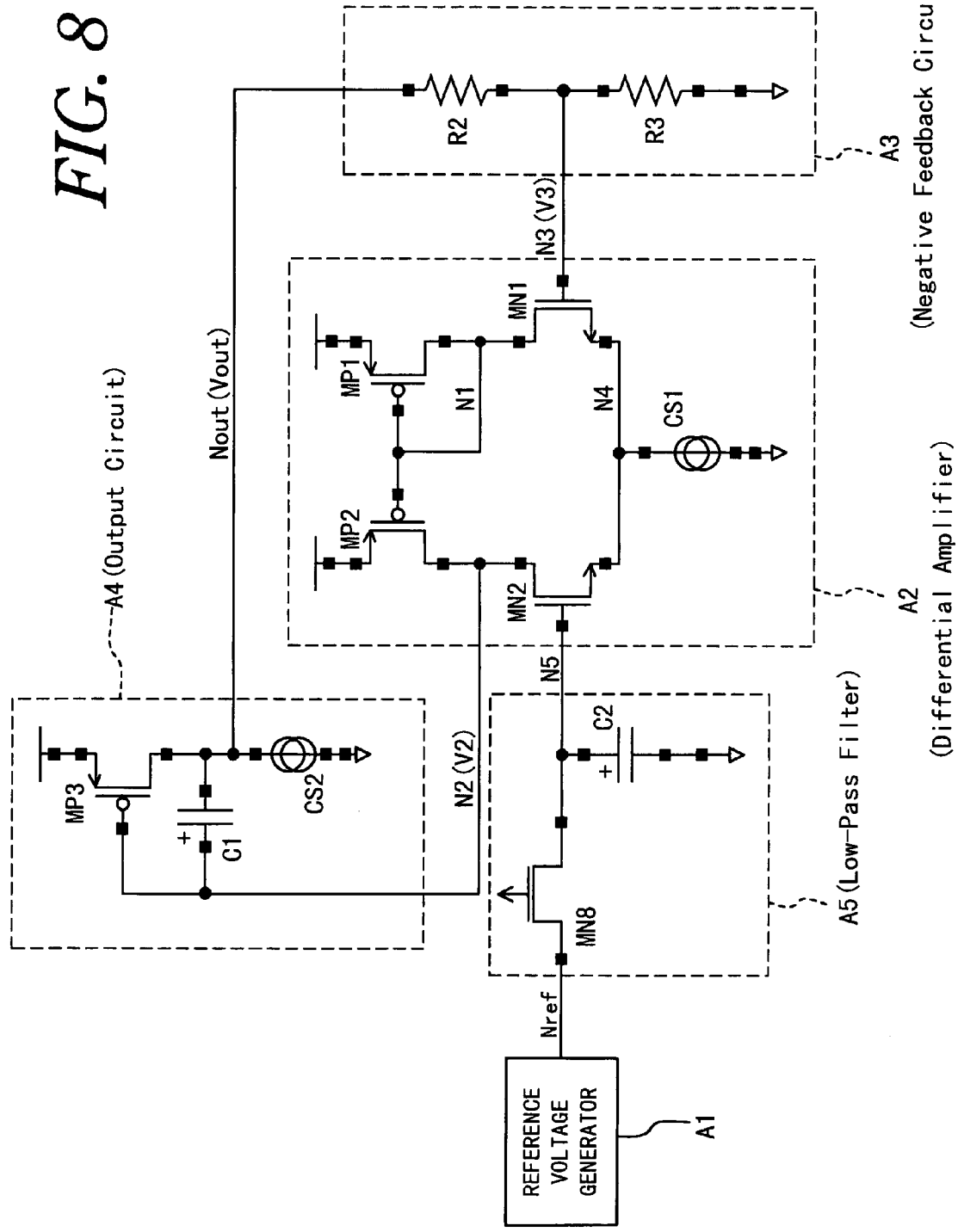
FIG. 8 is a circuit diagram illustrating a constant voltage generation device according to a second preferred embodiment of the invention.

FIG. 8 shows a constant voltage generation device according to a second preferred embodiment of the invention. In this embodiment, the same or corresponding components to those in the devices shown in FIGS. 1 and 5 are represented by the same symbols. In addition, detailed descriptions of the same components are not repeated here in the second preferred embodiment to avoid redundant description. The constant voltage generation device of this embodiment includes a reference voltage generator A1, a differential amplifier A2, a negative feedback circuit A3, an output circuit A4 and a low-pass filter A5.

The reference voltage generator A1 generates a predetermined reference voltage $V_{ref}$ and supplies it to a sixth node $N_{ref}$. The differential amplifier A2 detects the difference between the reference voltage $V_{ref}$ and a feedback voltage V3 from the negative feedback circuit A3, and amplifies the difference to generate an output signal (control signal) V2. The negative feedback circuit A3 divides an output voltage $V_{out}$ of the output circuit A4 and supplies the divided voltage to an input terminal of the differential amplifier A2. The output circuit A4 generates the output voltage $V_{out}$ in response to the control signal V2 at a node N2, supplied from the differential amplifier A2. The output voltage $V_{out}$ is supplied to an output node $N_{out}$.

The low-pass filter A5 includes an NMOS transistor MN8, which is serially connected between the sixth node $N_{ref}$ and the fifth node N5, and a capacitor C2, which is connected to the fifth node N5 and the ground $V_{ss}$. The difference between the first and second preferred embodiments is the components of the low-pass filter A5. The operation of the second preferred embodiment is almost the same as that of the first preferred embodiment, shown in FIG. 5.

Figure 9:
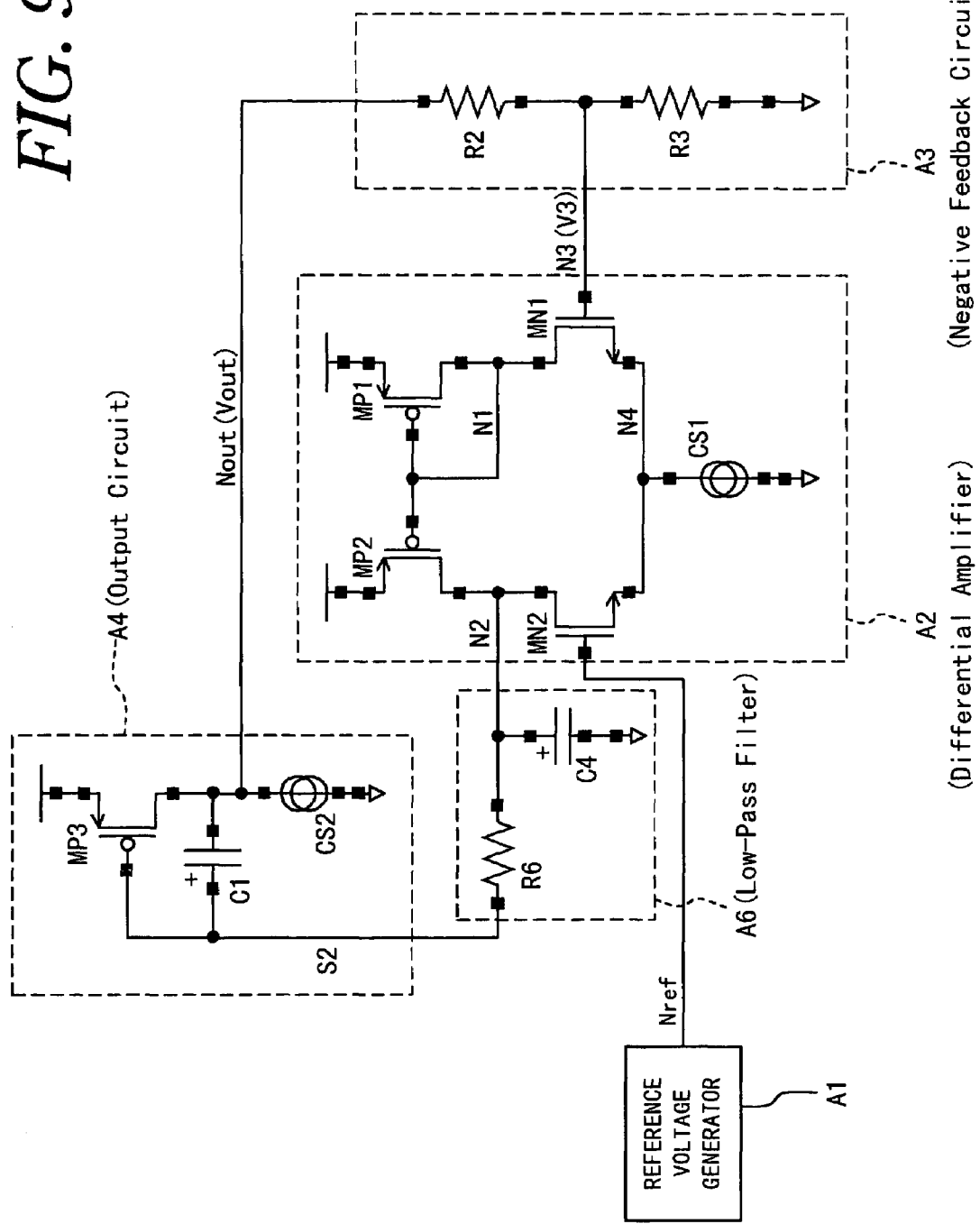
FIG. 9 is a circuit diagram illustrating a constant voltage generation device according to a third preferred embodiment of the invention.

FIG. 9 shows a constant voltage generation device according to a third preferred embodiment of the invention. In this embodiment, the same or corresponding components to those in the devices shown in FIGS. 1, 5 and 8 are represented by the same symbols. In addition, detailed descriptions of the same components are not repeated here in this embodiment to avoid redundant description. The constant voltage generation device of this embodiment includes a reference voltage generator A1, a differential amplifier A2, a negative feedback circuit A3, an output circuit A4 and a low-pass filter A6.

The reference voltage generator A1 generates a predetermined reference voltage $V_{ref}$ and supplies it to a sixth node $N_{ref}$. The differential amplifier A2 detects the difference between the reference voltage $V_{ref}$ and a feedback voltage V3 from the negative feedback circuit A3, and amplifies the difference to generate an output signal (control signal) V2. The negative feedback circuit A3 divides an output voltage $V_{out}$ of the output circuit A4 and supplies the divided voltage to an input terminal of the differential amplifier A2. The output circuit A4 generates the output voltage $V_{out}$ in response to the control signal V2 at a node N2, supplied from the differential amplifier A2. The output voltage $V_{out}$ is supplied to an output node $N_{out}$.

The low-pass filter A6 includes a resistor R6, which is serially connected between the second node N2 and the output circuit A4, and a capacitor C4, which is connected to the second node N5 and the ground $V_{ss}$. The difference between the first and third preferred embodiments is the arrangement of the low-pass filter A6. In the third preferred embodiment, the low-pass filter A6 removes (cuts of) short wave noises from a signal (control signal) at the second node N2, which is the output signal of the differential amplifier A2, to generate a second control signal S2 to be supplied to the output circuit A4. The output circuit A4 is controlled with the second control signal S2 to provide a constant output voltage $V_{out}$ at the output node $N_{out}$.

According to the third preferred embodiment, the low-pass filter A6 is provided between the differential amplifier A2 and the output circuit A4, so that voltage variations due to the short wave noises are not transferred to the input terminal of the output circuit A4, even though the reference voltage $V_{ref}$ involves short wave noises. As a result, oscillation and voltage variations of the output voltage $V_{out}$ at the output node $N_{out}$ can be effectively avoided, and therefore, the output voltage $V_{out}$ is maintained being constant.

Figure 10:
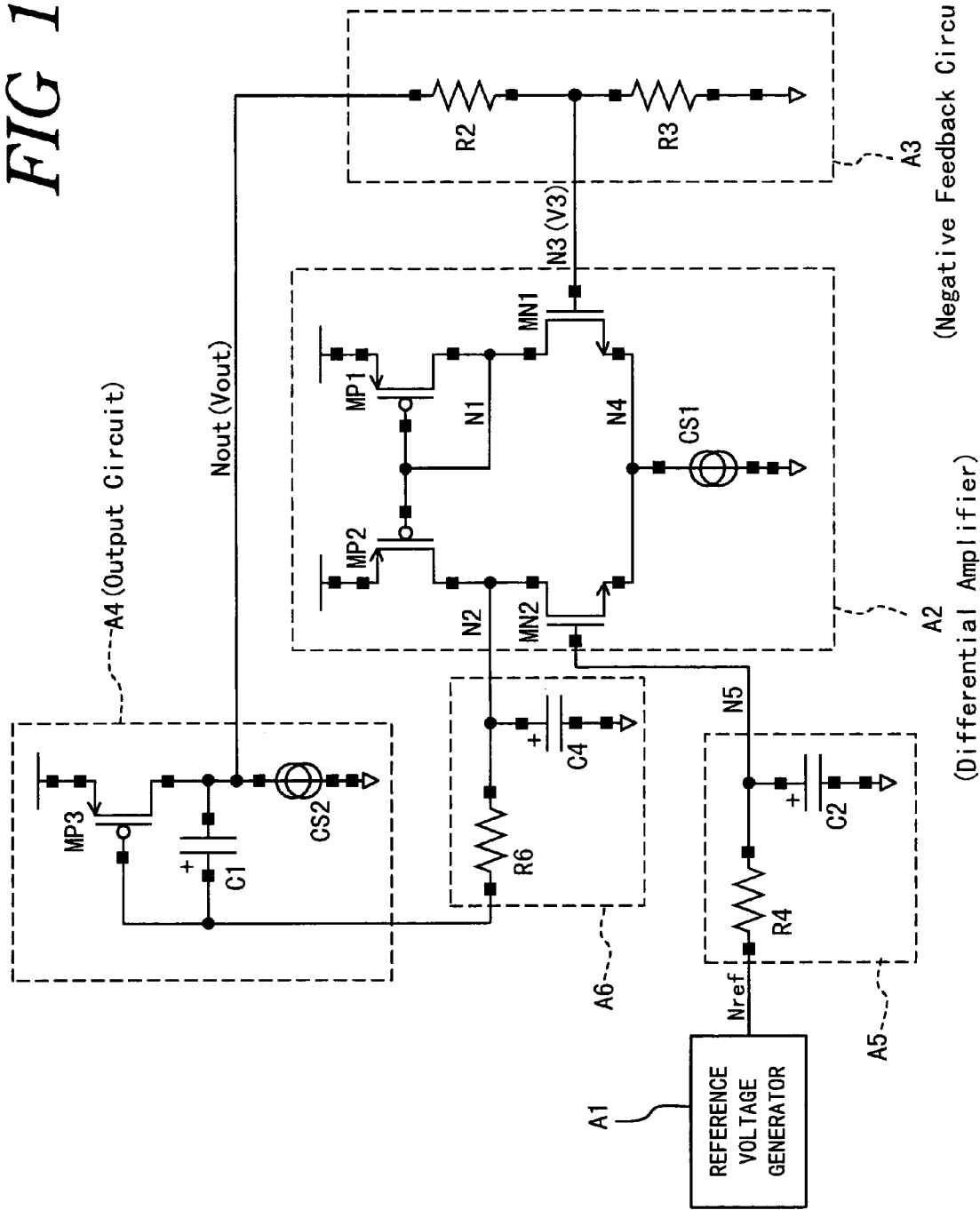
FIG. 10 is a circuit diagram illustrating a constant voltage generation device according to a fourth preferred embodiment of the invention.

FIG. 10 shows a constant voltage generation device according to a fourth preferred embodiment of the invention. In this embodiment, the same or corresponding components to those in the devices shown in FIGS. 1, 5, 8 and 9 are represented by the same symbols. In addition, detailed descriptions of the same components are not repeated here in this embodiment to avoid redundant description. The constant voltage generation device of this embodiment includes a reference voltage generator A1, a differential amplifier A2, a negative feedback circuit A3, an output circuit A4 and a pair of low-pass filters A5 and A6.

The reference voltage generator A1 generates a predetermined reference voltage $V_{ref}$ and supplies it to a sixth node $N_{ref}$. The differential amplifier A2 detects the difference between the reference voltage $V_{ref}$ and a feedback voltage V3 from the negative feedback circuit A3, and amplifies the difference to generate an output signal (control signal) V2. The negative feedback circuit A3 divides an output voltage $V_{out}$ of the output circuit A4 and supplies the divided voltage to an input terminal of the differential amplifier A2. The output circuit A4 generates the output voltage $V_{out}$ in response to the control signal V2 at a node N2, supplied from the differential amplifier A2. The output voltage $V_{out}$ is supplied to an output node $N_{out}$.

The low-pass filters A5 and A6 are designed and arranged to be the same as those in the first and third preferred embodiments, shown in FIGS. 5 and 9, respectively. The low-pass filter A5 is designed to remove (cut of) short wave noises from the reference voltage $V_{ref}$ at the sixth node $N_{ref}$ to maintain the reference voltage being constant. The low-pass filter A6 is designed to remove (cuts off) short wave noises from a signal (control signal) at the second node N2, which is the output signal of the differential amplifier A2, to generate a second control signal S2 to be supplied to the output circuit A4. The output circuit A4 is controlled with the second control signal S2 to provide a constant output voltage $V_{out}$ at the output node $N_{out}$.

According to the fourth preferred embodiment, the low-pass filters A5 and A6 are provided between the differential amplifier A2 and the output circuit A4, and between the differential amplifier A2 and the output circuit A4, respectively, so that voltage variations due to the short wave noises are not transferred to the input terminal of the output circuit A4. As a result, oscillation and voltage variations of the output voltage $V_{out}$ at the output node $N_{out}$ can be effectively avoided, and therefore, the output voltage $V_{out}$ is maintained being constant.

Figure 11:
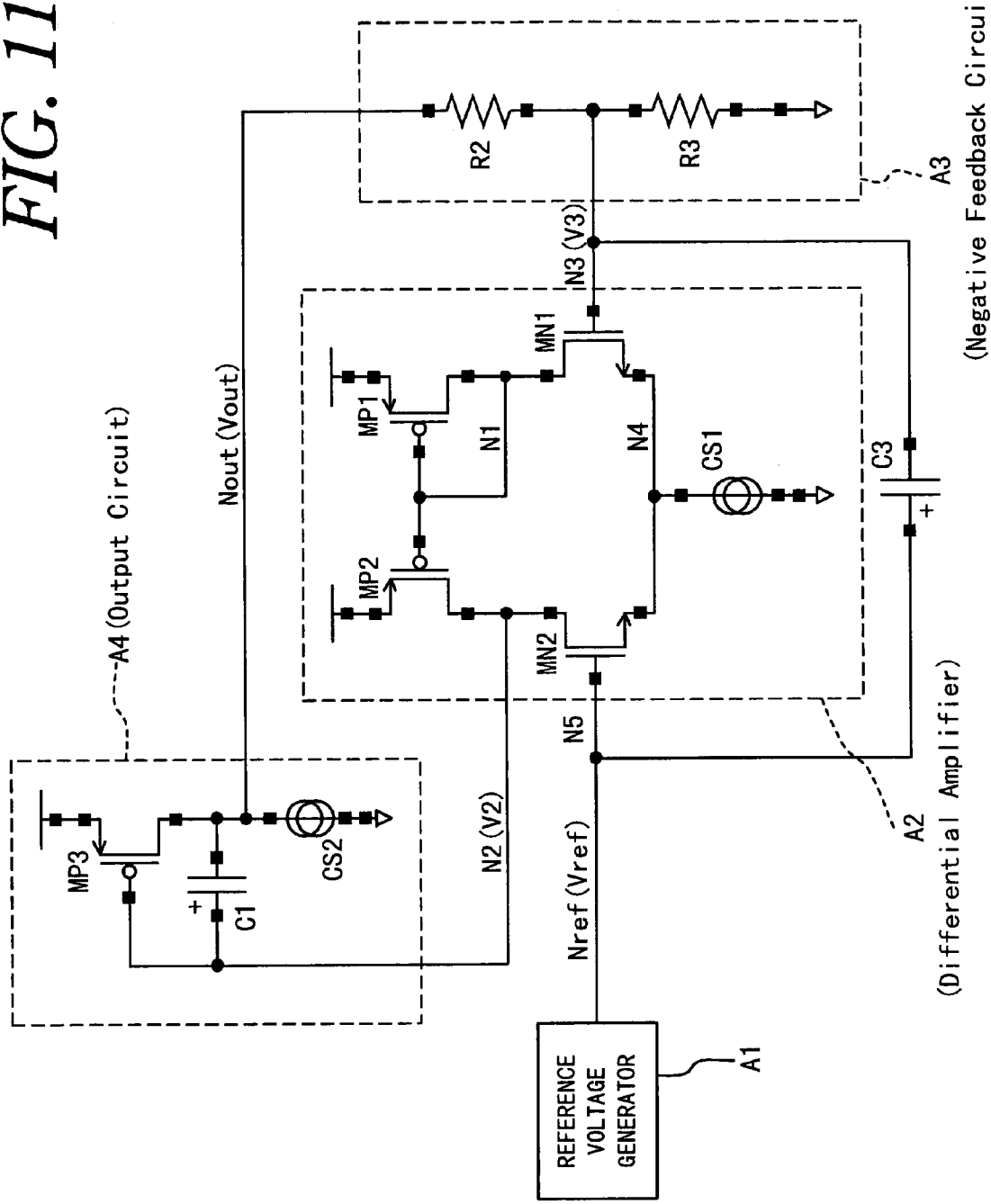
FIG. 11 is a circuit diagram illustrating a constant voltage generation device according to a fifth preferred embodiment of the invention.

FIG. 11 shows a constant voltage generation device according to a fifth preferred embodiment of the invention. In this embodiment, the same or corresponding components to those in the devices shown in FIGS. 1, 5, 8, 9 and 10 are represented by the same symbols. In addition, detailed descriptions of the same components are not repeated here in this embodiment to avoid redundant description. The constant voltage generation device of this embodiment includes a reference voltage generator A1, a differential amplifier A2, a negative feedback circuit A3, an output circuit A4 and a third capacitor C3.

The reference voltage generator A1 generates a predetermined reference voltage $V_{ref}$ and supplies it to a sixth node $N_{ref}$. The differential amplifier A2 detects the difference between the reference voltage $V_{ref}$ and a feedback voltage V3 from the negative feedback circuit A3, and amplifies the difference to generate an output signal (control signal) V2. The negative feedback circuit A3 divides an output voltage $V_{out}$ of the output circuit A4 and supplies the divided voltage to an input terminal of the differential amplifier A2. The output circuit A4 generates the output voltage $V_{out}$ in response to the control signal V2 at a node N2, supplied from the differential amplifier A2. The output voltage $V_{out}$ is supplied to an output node $N_{out}$.

The third capacitor C3 is connected to the input terminals of the differential amplifier A2, which is the feature of this embodiment. In other words, the third capacitor C3 is connected between the third node N3 and the sixth node $N_{ref}$ so as to supply voltage-variations due to short wave noises to both the input terminals of the differential amplifier A2.

Now, operation of the device according to the fifth preferred embodiment, in the case where no noise is added to the reference voltage $V_{ref}$, is first described. The differential amplifier A2 detects the voltage difference between the reference voltage $V_{ref}$, supplied from the reference voltage generator A1, and the feedback voltage V3, which is generated by resistor-dividing the output voltage $V_{out}$ at the output node $N_{out}$. When the feedback voltage V3 is lower than the reference voltage $V_{ref}$ (V3<$V_{ref}$), the gate voltage of the PMOS transistor MP3 is decreased to increase the output voltage $V_{out}$. On the other hand, when the feedback voltage V3 is higher than the reference voltage $V_{ref}$ (V3>$V_{ref}$), the gate voltage of the PMOS transistor MP3 is increased to decrease the output voltage $V_{out}$. As a result, the output voltage $V_{out}$ at the output node $N_{out}$ is controlled to be a constant value of "$V_{ref}*(R2+R3)/R3$".

Figure 12:
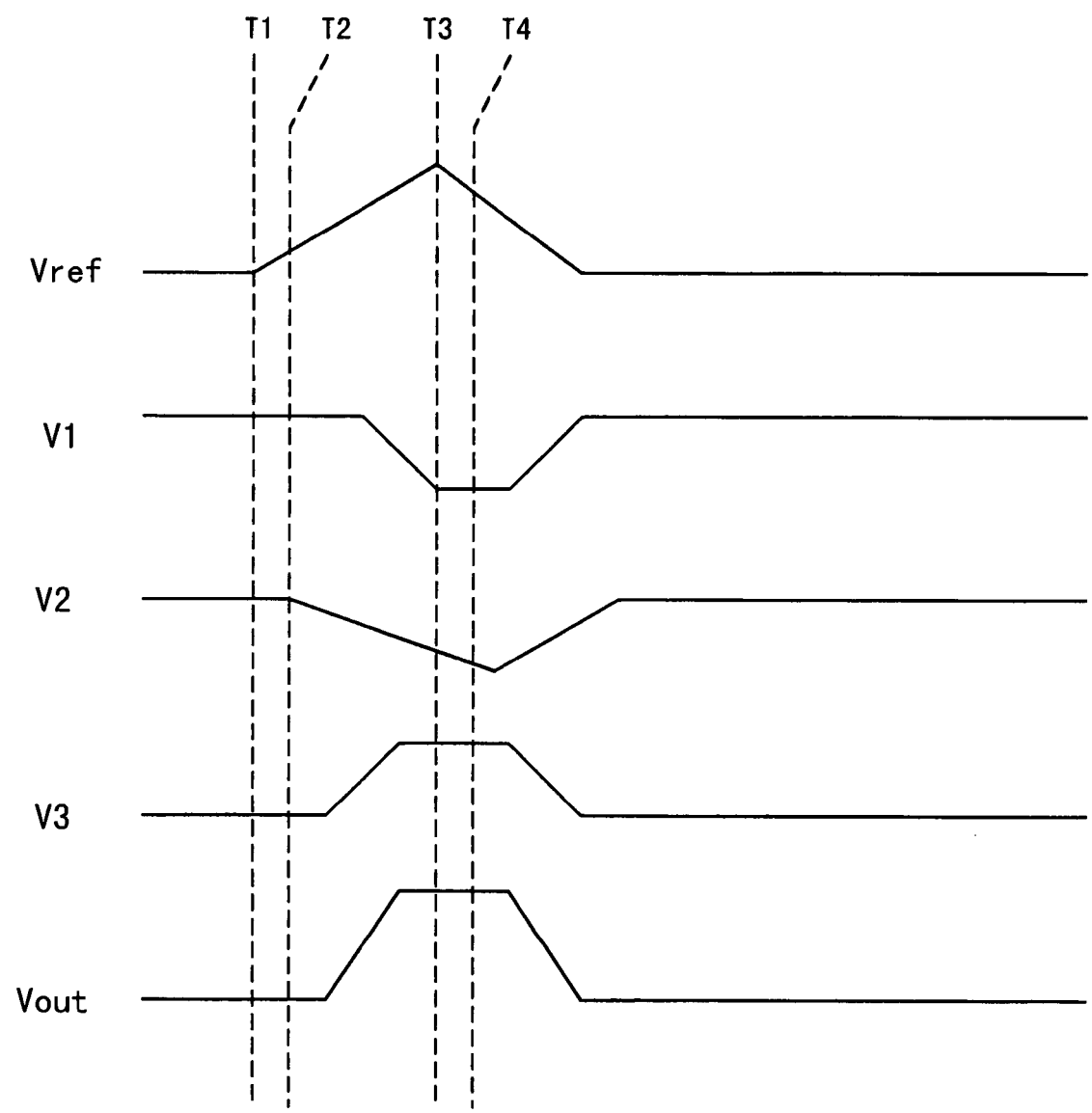
FIGS. 12 and 13 are timing charts showing the operation of the constant voltage generation device, shown in FIG. 11.

Next, operation of the device according to the fifth preferred embodiment, in the case where long wave noises are intermittently added to the reference voltage $V_{ref}$, is described in conjunction with FIG. 12. In this case, the voltage variations of the reference voltage $V_{ref}$ is small, so that the third capacitor C3 can be seen as a high-impedance circuit. As a result, charging and discharging current is very small and therefore, the third capacitor C3 can be seen not to exist in the circuitry.

As shown in FIG. 12, when the reference voltage $V_{ref}$ starts going up in response to the noises, the voltage V2 at the second node N2 goes down, then the output voltage $V_{out}$ at the output node $N_{out}$ and the voltage V3 at the third node N3 start going up. However, those kinds of voltage variations are temporarily, but not repeated. As a result, the output voltage $V_{out}$ at the output node $N_{out}$ only changes slowly (gradually), and the change happens temporarily and is not repeated.

Figure 13:
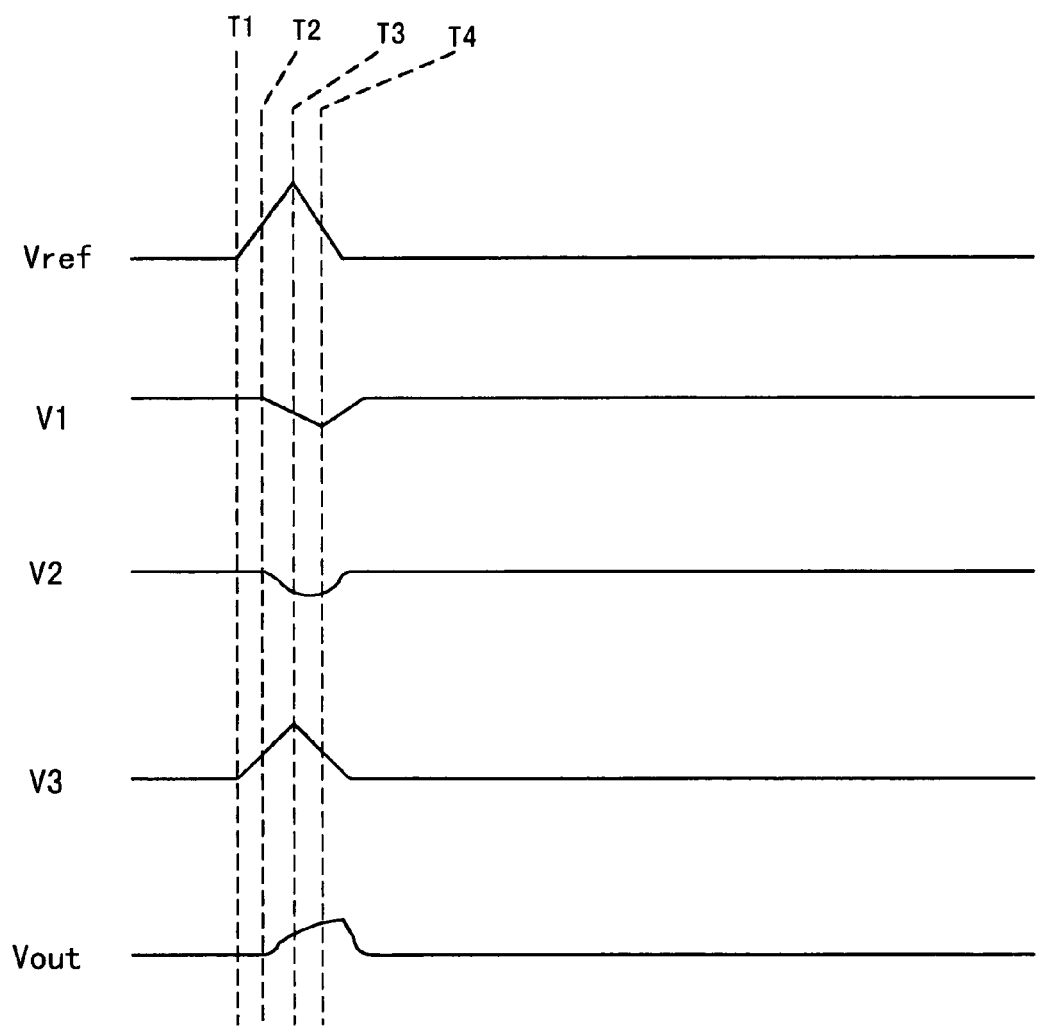

Next, operation of the device according to the fifth preferred embodiment, in the case where short wave noises are intermittently added to the reference voltage $V_{ref}$, is described in conjunction with FIG. 13. In this embodiment, the third capacitor C3 functions as a low-impedance circuit relative to voltage variations due to the noises, so that large amounts of charge current and discharge current flow through the capacitor C3. Thus, more current (charge current) is flowing through the third capacitor C3 than through the resistor R2, so that the voltage V3 at the third node N3 changes in synchronization with the reference voltage $V_{ref}$.

When the reference voltage $V_{ref}$ goes up, the voltage V3 at the third node N3 goes up as well in response to the charge current. In contrast, when the reference voltage $V_{ref}$ goes down, the voltage V3 at the third node N3 goes down. The change of situation between the rise and fall of the voltage V3 happens quickly without a time delay, such as for the conventional circuit.

The temporarily decreased (increased) current, flowing though the NMOS transistor MN1 and the PMOS transistors MP1 and MP2, can be controlled to be equal to the drain current of the NMOS transistor MN2. As a result, the voltage variations at the second node N2 in response to the rise (fall) of the reference voltage $V_{ref}$ become small. When the reference voltage $V_{ref}$ becomes stable, the voltage V2 at the second node N2 becomes as it was before the voltage variations happened. The voltage variations of the output voltage $V_{out}$ at the output node $N_{out}$ are not larger than that of the reference voltage $V_{ref}$. The voltage variations of the output voltage $V_{out}$ are not repeated.

Next, operation of the device according to the fifth preferred embodiment, in the case where short wave noises are successively added to the reference voltage $V_{ref}$ is described. Basically, the operation in this case is the same as that in the case of intermittent short wave noises. The variations of the reference voltage $V_{ref}$ are supplied to both the input terminals of the differential amplifier A2 in the common mode, so that the effect of the variations is converged for each wave. As a result, even if the short wave noises are successively added to the reference voltage $V_{ref}$, the voltages $V_{ref}$ and V3 at the sixth and third nodes $N_{ref}$ and N3 become identical when the voltage variations end.

As described above, according to the fifth preferred embodiment, the third capacitor C3 is provided between the sixth node $N_{ref}$ and the third node N3, so that variations of the reference voltage $V_{ref}$ due to the short wave noises are transferred to the third node N3 in the common mode. As a result, the voltage V2 at the second node N2 changes in synchronization with the variations of the reference voltage $V_{ref}$, and therefore, the output voltage $V_{out}$ at the output node $N_{out}$ can be maintained being constant when the variations of the reference voltage end.

Figure 14:
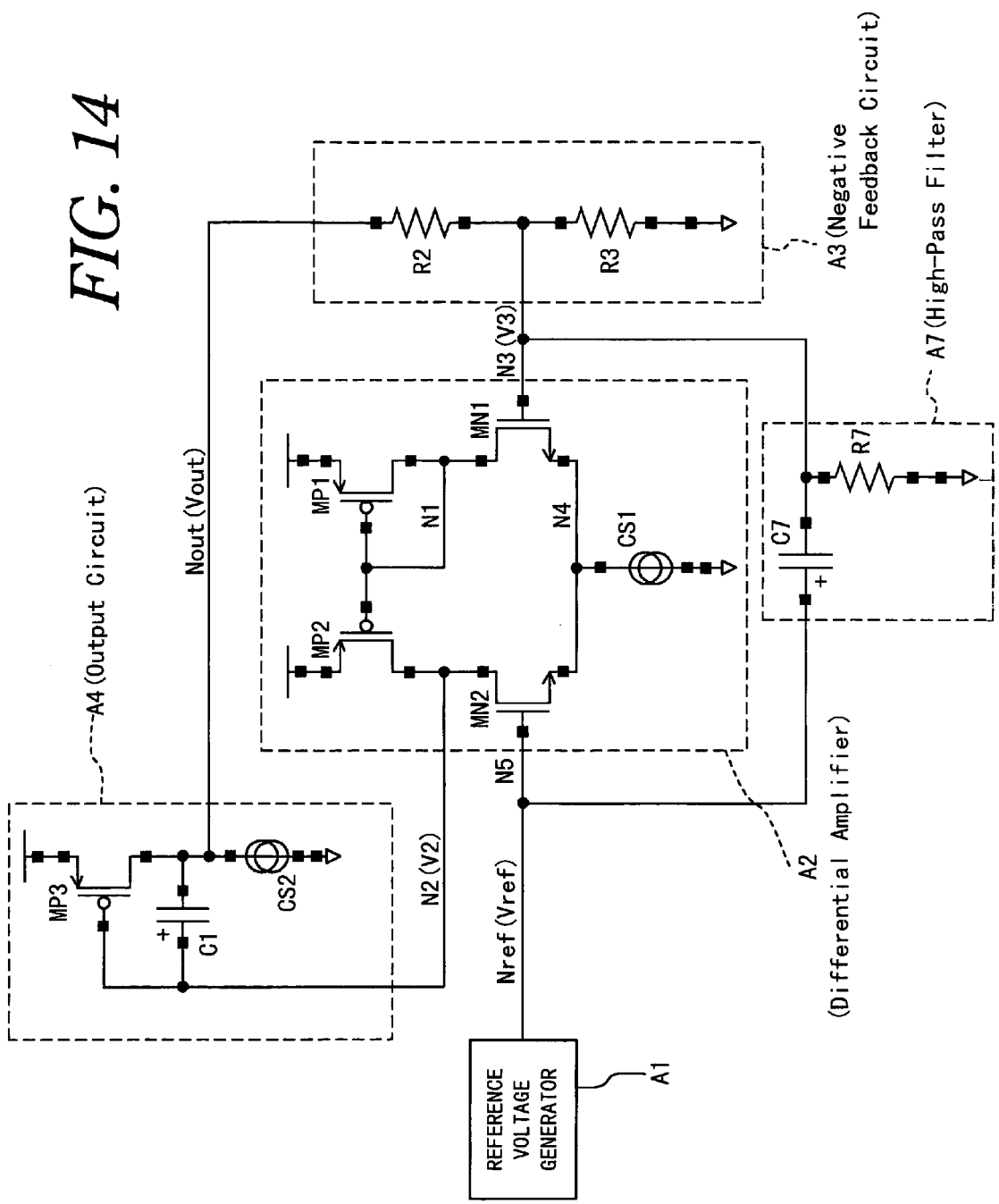
FIG. 14 is a circuit diagram illustrating a constant voltage generation device according to a sixth preferred embodiment of the invention.

FIG. 14 shows a constant voltage generation device according to a sixth preferred embodiment of the invention. In this embodiment, the same or corresponding components to those in the devices shown in FIGS. 1, 5, 8, 9, 10 and 12 are represented by the same symbols. In addition, detailed descriptions of the same components are not repeated here in this embodiment to avoid redundant description. The constant voltage generation device of this embodiment includes a reference voltage generator A1, a differential amplifier A2, a negative feedback circuit A3, an output circuit A4 and a high-pass filter A7.

The reference voltage generator A1 generates a predetermined reference voltage $V_{ref}$ and supplies it to a sixth node $N_{ref}$. The differential amplifier A2 detects the difference between the reference voltage $V_{ref}$ and a feedback voltage V3 from the negative feedback circuit A3, and amplifies the difference to generate an output signal (control signal) V2. The negative feedback circuit A3 divides an output voltage $V_{out}$ of the output circuit A4 and supplies the divided voltage to an input terminal of the differential amplifier A2. The output circuit A4 generates the output voltage $V_{out}$ in response to the control signal V2 at a node N2, supplied from the differential amplifier A2. The output voltage $V_{out}$ is supplied to an output node $N_{out}$.

The high-pass filter A7 includes a capacitor C7, which is connected to the input terminals of the differential amplifier A2, and a resistor A7, which is connected to the node N3 and the ground $V_{ss}$.

In the same manner as the fifth preferred embodiment, shown in FIG. 11, variations of the reference voltage $V_{ref}$ due to short wave noises are transferred to the third node N3 in the common mode. As a result, the voltage V2 at the second node N2 changes in synchronization with the variations of the reference voltage $V_{ref}$, and therefore, the output voltage $V_{out}$ at the output node $N_{out}$ can be maintained being constant when the variations of the reference voltage end.

Figure 15:
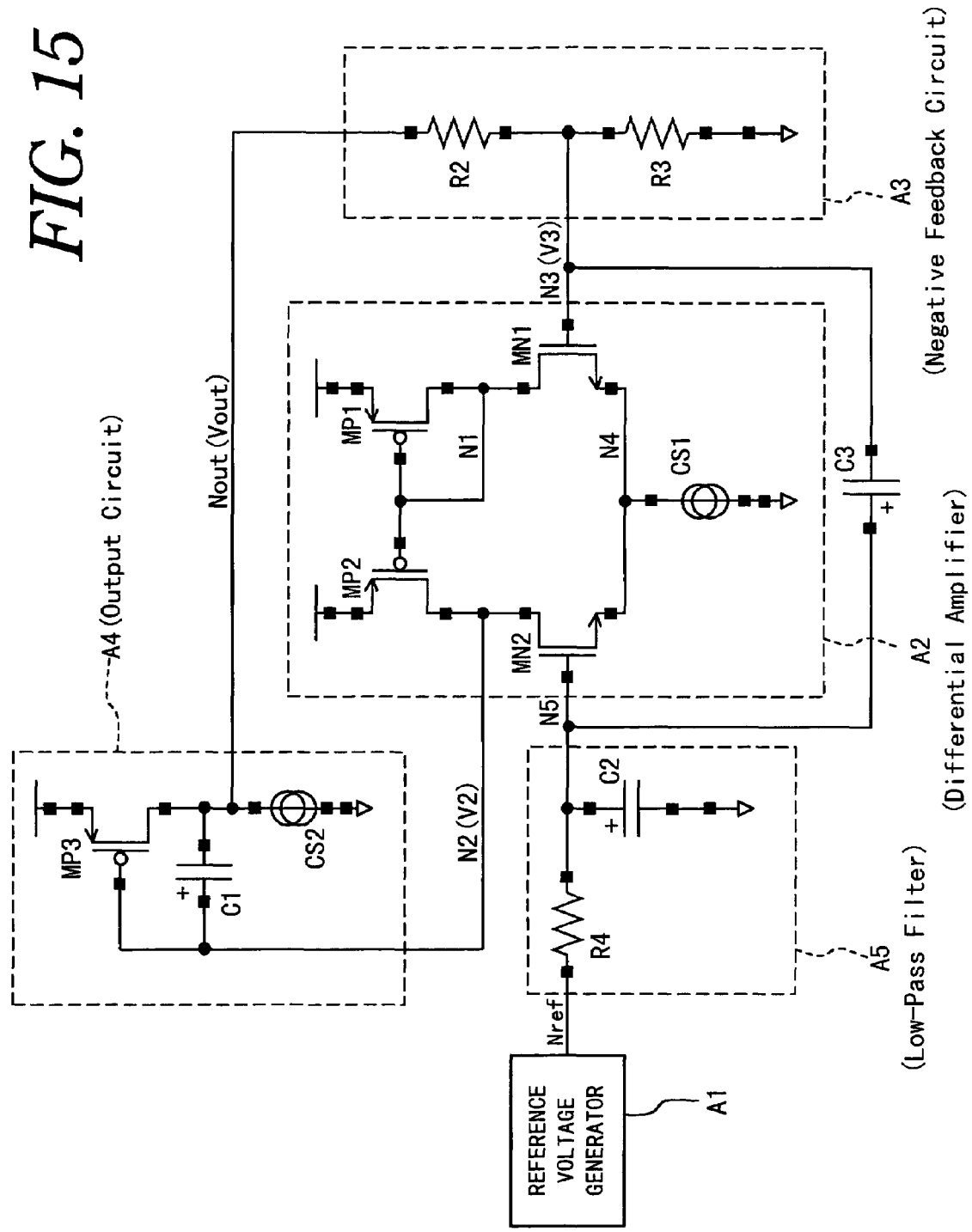
FIG. 15 is a circuit diagram illustrating a constant voltage generation device according to a seventh preferred embodiment of the invention.

FIG. 15 shows a constant voltage generation device according to a seventh preferred embodiment of the invention. In this embodiment, the same or corresponding components to those in the devices shown in FIGS. 1, 5, 8, 9, 10, 12 and 14 are represented by the same symbols. In addition, detailed descriptions of the same components are not repeated here in this embodiment to avoid redundant description. The constant voltage generation device of this embodiment includes a reference voltage generator A1, a differential amplifier A2, a negative feedback circuit A3, an output circuit A4, a low-pass filter A5 and a capacitor C3.

The reference voltage generator A1 generates a predetermined reference voltage $V_{ref}$ and supplies it to a sixth node $N_{ref}$. The differential amplifier A2 detects the difference between the reference voltage $V_{ref}$ and a feedback voltage V3 from the negative feedback circuit A3, and amplifies the difference to generate an output signal (control signal) V2. The negative feedback circuit A3 divides an output voltage $V_{out}$ of the output circuit A4 and supplies the divided voltage to an input terminal of the differential amplifier A2. The output circuit A4 generates the output voltage $V_{out}$ in response to the control signal V2 at a node N2, supplied from the differential amplifier A2. The output voltage $V_{out}$ is supplied to an output node $N_{out}$.

It can be understood that the seventh preferred embodiment, shown in FIG. 15, includes the combined features of the first preferred embodiment and the fifth preferred embodiment shown in FIGS. 5 and 11.

According to the seventh preferred embodiment, the low-pass filter A5 is provided between the reference voltage generator A1 and the differential amplifier A2, so that voltage variations due to the short wave noises are not transferred to an input terminal of the differential amplifier A2. In addition, even though short wave noises are added to the reference voltage $V_{ref}$, variations of the reference voltage $V_{ref}$ due to short wave noises are transferred to the third node N3 in the common mode, because the capacitor C3 is provided between the fifth node N5 and the third node N3. As a result, the voltage V2 at the second node N2 changes in synchronization with the variations of the reference voltage $V_{ref}$. Consequently, oscillation and voltage variations of the output voltage $V_{out}$ at the output node $N_{out}$ can be effectively avoided, so that the output voltage $V_{out}$ at the output node $N_{out}$ can be maintained being constant.

It will be understood that the above description of the present invention is susceptible to various modifications, changes and adaptations, and the same are intended to be comprehended with the meaning and range of equivalents of the appended claims.

Figure 16:
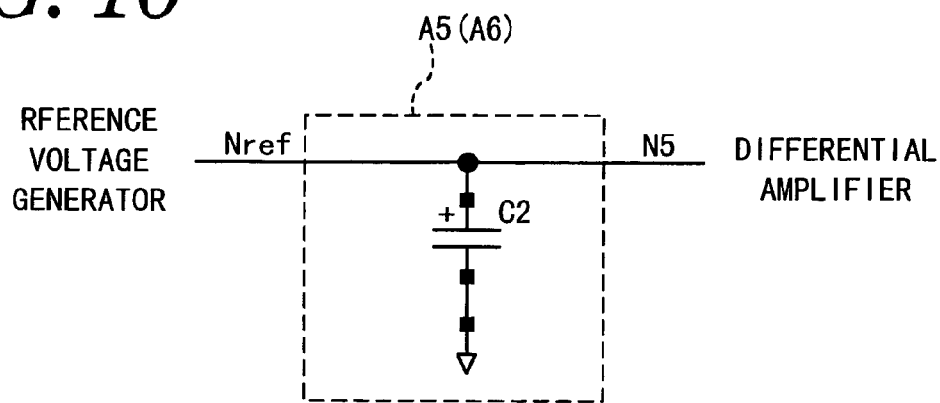
FIGS. 16 to 18 are circuit diagrams each illustrating a modified example of a low-pass filter, used in the invention.
Figure 17:
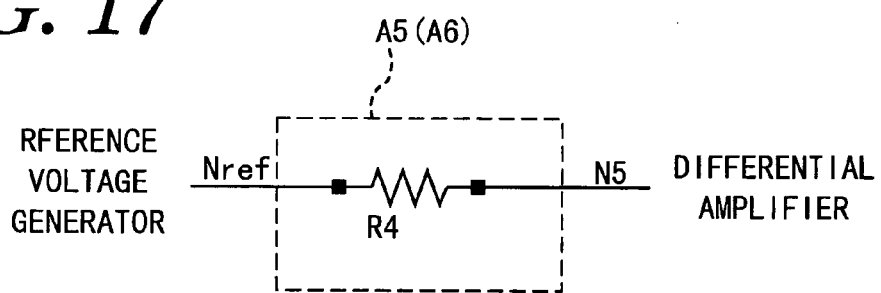
Figure 18:
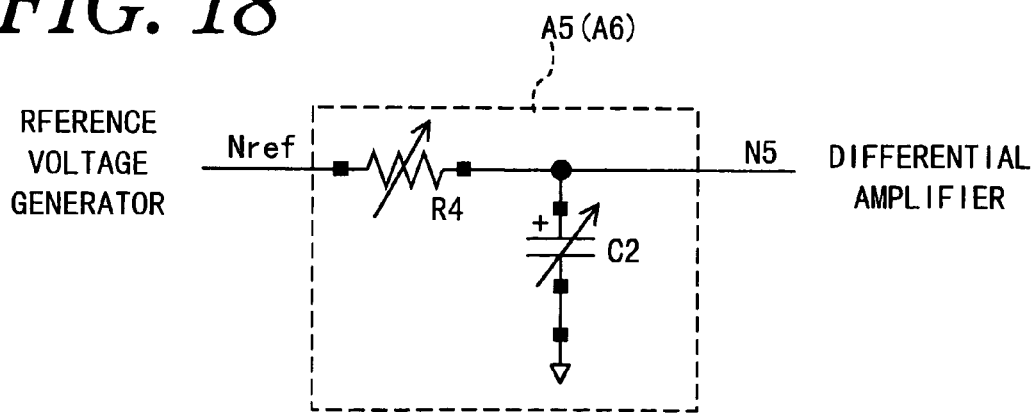

For example, in the above described first, third, fourth and seventh preferred embodiments, shown in FIGS. 5, 9, 10 and 15, the low-pass filter A5 and A6 can be modified to be as shown in FIGS. 16 and 17. The low-pass filter, shown in FIG. 16, is composed only of the capacitor C2, while the low-pass filter, shown in FIG. 17, is composed only of the resistor R4. Further, as shown in FIG. 18, the capacitor C2 and the resistor R4 can be of variable type to provide better control of the output voltage $V_{out}$. In the fifth and seventh preferred embodiments, shown in FIGS. 11 and 15, the capacitor C3 can be of variable type to provide better control of the output voltage $V_{out}$.

In each embodiment, the output voltage $V_{out}$ at the output node $N_{out}$ is divided to generate the voltage V3 in the negative feedback circuit A3. However, the output voltage $V_{out}$ at the output node $N_{out}$ can be directly applied to the differential amplifier A2. The transistors used in each embodiment can be opposite type between P-channel and N-channel. The transistors used in each embodiment are not limited by MOS type, but can be other types, such as bipolar type.

What is claimed is:

1. A constant voltage generation device comprising:
   a reference voltage generation circuit operable to generate a reference voltage;
   an output circuit operable to generate an output voltage;
   a differential amplifier operable to generate a control signal based on the reference voltage and the output voltage; and
   a noise control circuit operable to remove short wave noises from the control signal to provide a second control signal, wherein
   the output circuit is controlled in response to the second control signal so that the output voltage is constant, and
   the noise control circuit comprises a resistor serially connected between an output terminal of the differential amplifier and an input terminal of the output circuit; and a capacitor connected between a second terminal and the output terminal of the differential amplifier.

2. The constant voltage generation device according to claim 1, wherein
   the second terminal is grounded.

3. A constant voltage generation device comprising:
   a reference voltage generation circuit operable to generate a reference voltage;
   an output circuit operable to generate an output voltage;

a differential amplifier operable to generate a control signal based on the reference voltage and the output voltage; and a first noise control circuit operable to remove short wave noises from the reference voltage; and a second noise control circuit operable to remove short wave noises from the control signal to provide a second control signal, wherein the output circuit is controlled in response to the second control signal so that the output voltage is constant, the first noise control circuit comprises a first resistor serially connected between the reference voltage generation circuit and a first input terminal of the differential amplifier; and a first capacitor connected between a first terminal and the first input terminal of the differential amplifier, and the second noise control circuit comprises a second resistor serially connected between an output terminal of the differential amplifier and an input terminal of the output circuit; and a second capacitor connected between a second terminal and the output terminal of the differential amplifier.

4. The constant voltage generation device according to claim 3, wherein each of the first and second terminals is grounded.

5. A constant voltage generation device comprising:

a reference voltage generation circuit operable to generate a reference voltage;

an output circuit operable to generate an output voltage;

a differential amplifier operable to generate a control signal based on the reference voltage and the output voltage; and a noise control circuit operable to extract short wave noises from the reference voltage, to be supplied to a first input terminal of the differential amplifier, and supply the extracted short wave noises into the output voltage, to be supplied to a second input terminal of the differential amplifier, wherein the output circuit is controlled in level in response to the control signal so that the output voltage is constant.

6. The constant voltage generation device according to claim 5, wherein the noise control circuit comprises a capacitor connected between the first input terminal and the second input terminal of the differential amplifier so that the short wave noises are cancelled.

7. The constant voltage generation device, according to claim 5, wherein the noise control circuit is a high-pass filter connected between the first and second input terminals of the differential amplifier.

8. The constant voltage generation device according to claim 5, further comprising:

a second noise control circuit operable to remove short wave noises from the reference voltage.

* * * * *